United States Patent
Cariello et al.

(10) Patent No.: US 10,901,622 B2
(45) Date of Patent: Jan. 26, 2021

(54) ADJUSTABLE NAND WRITE PERFORMANCE

(71) Applicant: Micron Technology, Inc., Boise, ID (US)

(72) Inventors: Giuseppe Cariello, Boise, ID (US); Mauro Luigi Sali, Sant'Angelo Lodigiano (IT); Stefano Falduti, Vimercate (IT); Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 16/236,040

(22) Filed: Dec. 28, 2018

(65) Prior Publication Data

US 2020/0210067 A1 Jul. 2, 2020

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
CPC ....... G06F 3/061; G06F 3/0655; G06F 3/0679
See application file for complete search history.

(56) References Cited

U.S. PATENT DOCUMENTS

| | | | |
|---|---|---|---|
| 2004/0114420 A1* | 6/2004 | Hsu | G11C 7/1078 365/149 |
| 2012/0246389 A1* | 9/2012 | Nagashima | G11C 7/1045 711/103 |
| 2013/0275650 A1* | 10/2013 | Hida | G06F 12/0246 711/102 |
| 2013/0346676 A1* | 12/2013 | Kim | G06F 12/0246 711/103 |
| 2014/0181376 A1* | 6/2014 | Miyamoto | G06F 12/0246 711/103 |
| 2017/0032836 A1* | 2/2017 | Kimura | G11C 7/04 |
| 2018/0277173 A1* | 9/2018 | Takizawa | G06F 13/00 |
| 2020/0081830 A1* | 3/2020 | Desai | G06F 11/1441 |

\* cited by examiner

*Primary Examiner* — Hiep T Nguyen
(74) *Attorney, Agent, or Firm* — Schwegman Lundberg & Woessner, P.A.

(57) ABSTRACT

Devices and techniques for adjustable memory device write performance are described herein. An accelerated write request can be received at a memory device from a controller of the memory device. The memory device can identify that a target block for external writes is opened as a multi-level cell block. The memory device can then write data for the accelerated write request to the target block using a single-level cell encoding.

24 Claims, 8 Drawing Sheets

ADJUSTABLE NAND WRITE PERFORMANCE

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), or magnetoresistive random-access memory (MRAM), among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
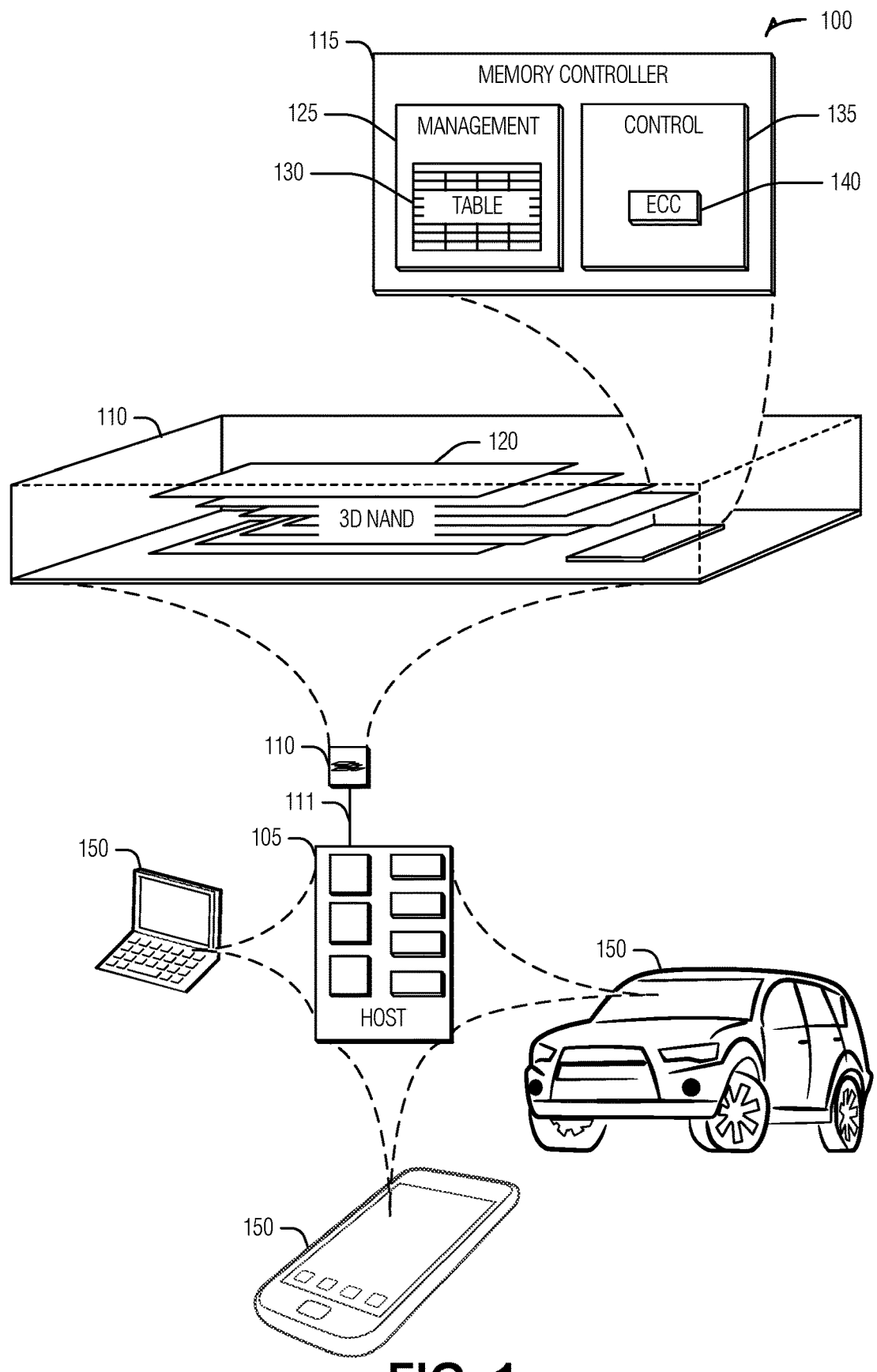
FIG. 1 illustrates an example of an environment including a memory device.

Managed NAND flash memory devices often employ a cache to improve write throughput when MLC encoding (e.g., programming mode) is used. For example, if data written to the memory device will ultimately be stored in a TLC encoding, an SLC cache block can be used to quickly store the write data from the host—because SLC writes are often much faster than MLC writes. This enables the host to move on to other tasks while the memory device takes the time it needs to transcribe that data to TLC blocks (e.g., in the background) for final storage.

Some memory controllers implement a "one open block for host writing" policy (e.g., one open cursor for direct host writes) for reasons of performance or hardware design efficiency. When using the SLC cache, the cached block is open for the host write. This can be considered a high-speed write configuration. However, in certain conditions—such as when available space in the memory device becomes too low—the SLC cache is disabled and an MLC block is opened for direct host writes. This can be considered a low-speed configuration.

The high-speed and low-speed arrangement described above can have a few drawbacks. First, transferring the data from the SLC cache to the ultimate MLC destination causes write amplification even when the additional write performance is not needed. Second, because blocks are generally restricted to be of one type of encoding (e.g., either SLC or MLC but not both), when transitioning to the low-speed configuration, the current MLC block must be filled before switching back to the high-speed configuration (e.g., opening another SLC block for the SLC cache). This can happen if, for example, space was freed when the host was idle after switching to the low-speed configuration, and the host awakes and attempts to write data at a high-speed. Thus, in this last example, the additional write performance is not available when it is needed. Although it is possible to fill the rest of the open MLC block with filler data, this still involves some work by the memory device and can be wasteful of the underlying storage resources.

To address the inflexibility and write amplification issues noted above, a mixed encoding can be used. Specifically, a pseudo SLC (pSLC) is described that can be used within an MLC block. The enables a switch from slow MLC writes (e.g., two-level MLC, TLC, QLC, etc.) to fast single level writes—pSLC, which can be different than standard SLC encoding—and back without opening a different block. In an example, pSLC can be defined such that its page values have enough coupling to adjacent MLC pages and enable a read operation with the same read levels (e.g., trims) of a normal MLC read operation (e.g., with respect to the description below of FIGS. 3-6, LP read using RL3 on the FG-NAND and LP using RL1+RL5 or UP using RL3+RL7 on the RG-NAND). By enabling a single block to have both the speed of SLC encoding and the density of MLC encoding, the memory device can balance storage availability with write throughput at high speed. This enables more efficient use of the underlying hardware, resulting in higher performance or reduced device requirements. Additional details and examples are provided below.

Figure 2:
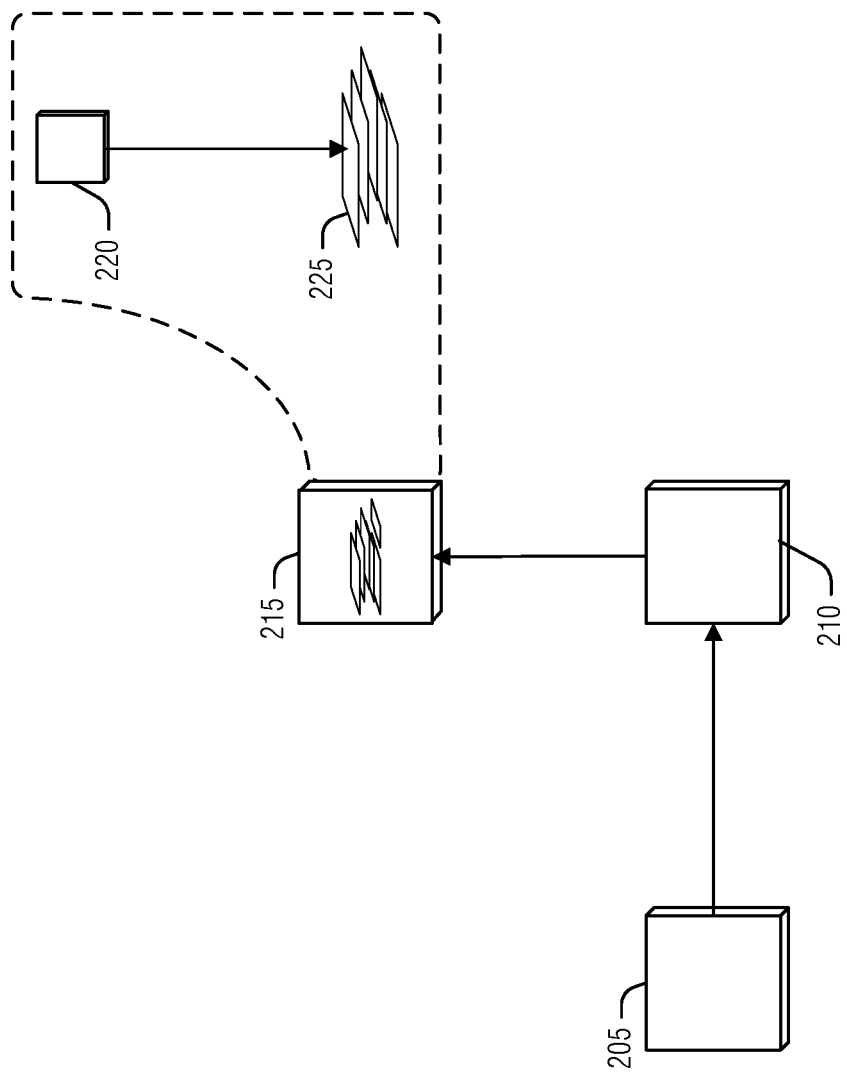
FIG. 2 illustrates an example of a system that implements adjustable write performance.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150. FIG. 2 provides details more specific to the adjustable NAND write performance using pSLC encoding.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMCT™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 800 of FIG. 8.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. Although the memory controller 115 is here illustrated as part of the memory device 110 package, other configurations can be employed, such as the memory controller 115 being a component of the host 105 (e.g., as a discrete package on a system-on-a-chip of the host 105 that is separate from the memory service 110), or even implemented via a central processing unit (CPU) of the host 105.

The memory manager 125 can include, among other things, circuitry or firmware, such as several components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a logical-to-physical (L2P) mapping.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance can include removing (e.g., retiring) failing memory resources (e.g., memory cells, memory arrays, pages, blocks, etc.) to prevent future errors. RAIN is another technique that can be employed by the memory device 110 to maintain data integrity. The array controller 135 can be arranged to implement RAIN parity data generation and storage in the array 120. The memory controller 115 can be involved in using the parity data to reconstruct damaged data.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

FIG. 2 illustrates an example of a system that implements adjustable write performance. The system illustrated here is in the context of the environment described above. This system includes a host 205 (e.g., the host 105 in FIG. 1) communicating with a memory controller 210 (e.g., the memory controller 115 in FIG. 1) to perform a write. The memory controller 210 interacts with the memory device 215. The memory device 215 includes a controller 220 (e.g., the array controller 135 in FIG. 1) and a storage array 225 (e.g., array 120 in FIG. 1). The memory controller 210 can be included in the same package as the memory device 215, as shown in FIG. 1, or separated, as illustrated here. The following examples describe a configuration of the array controller 220 to implement adjustable write performance techniques. However, in some examples, these features can be wholly or partly accomplished by the memory controller 210.

The array controller 220 is configured to receive an accelerated write request is received from the controller 210. Here, the write request can be designated as accelerated because the memory device 215 is in a high-speed mode of operation, or the write request can include an explicit indication that the write be performed at high-speed. In an example, the controller 210 can include an interface to a high speed request from the host 205. In an example, the transition from a performance mode of cache operation to a compact mode of cache operation can be based on workload detection by the controller 210 or via an explicit request from the host 205. In an example, the host 205 signals the change in operation via a register (e.g., flag) to set and read with a query command (e.g., in the universal flash storage protocol) to switch and check current mode of operation. In an example, dedicated commands, or dedicated fields in the write command can be used. The latter example lends itself to overloading a group number definition to implement multiple cursors such that there is no switching between modes (e.g., both modes can be active in the same time and each write command specifies to which cursor to send the data.

The array controller 220 is configured to identify that external write cursor (e.g., opened block) is an MLC block. In an example, an external write is any write that does not originate from circuitry of the memory device 215. In an example, the target block is alone in being open for external writes (e.g., the memory device 215 has only one cursor open for external writes at any given time).

The array controller 220 is configured to write the data to the target block using an SLC encoding. This SLC encoding is called pSLC because, while encoding one bit per cell, it may operation in a manner different than SLC blocks in the memory device 215. In an example, the single-level cell encoding uses charge distributions based on charge distributions for a type of MLC encoding for the target block. In an example, the type of multi-level cell encoding is a TLC encoding or greater. Using existing MLC charge distributions enables a read to proceed in the same manner without regard to the underlying encoding.

Figure 4:
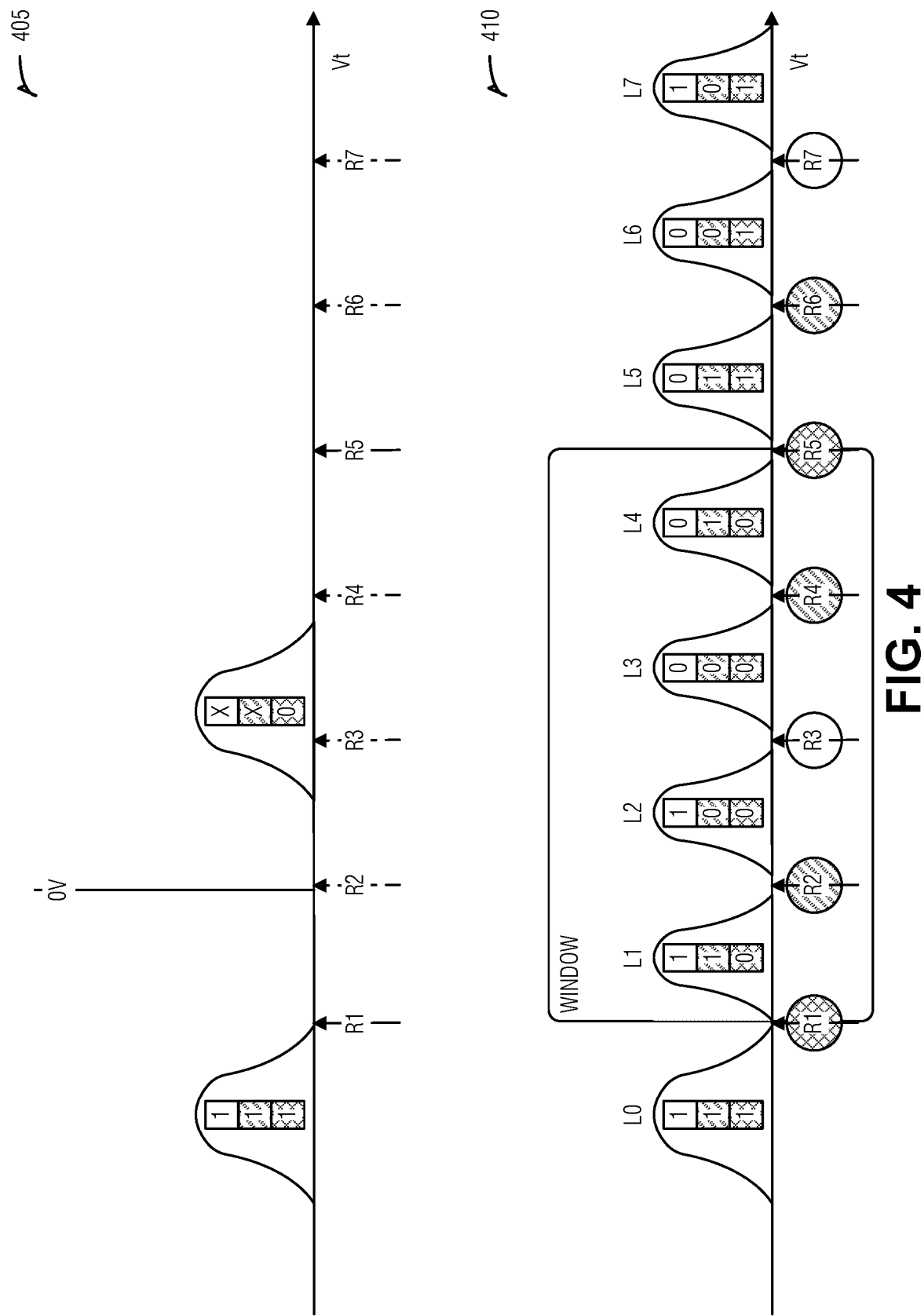
FIGS. 4-6 illustrate examples of pseudo SLC (pSLC) grey codes.
Figure 5:
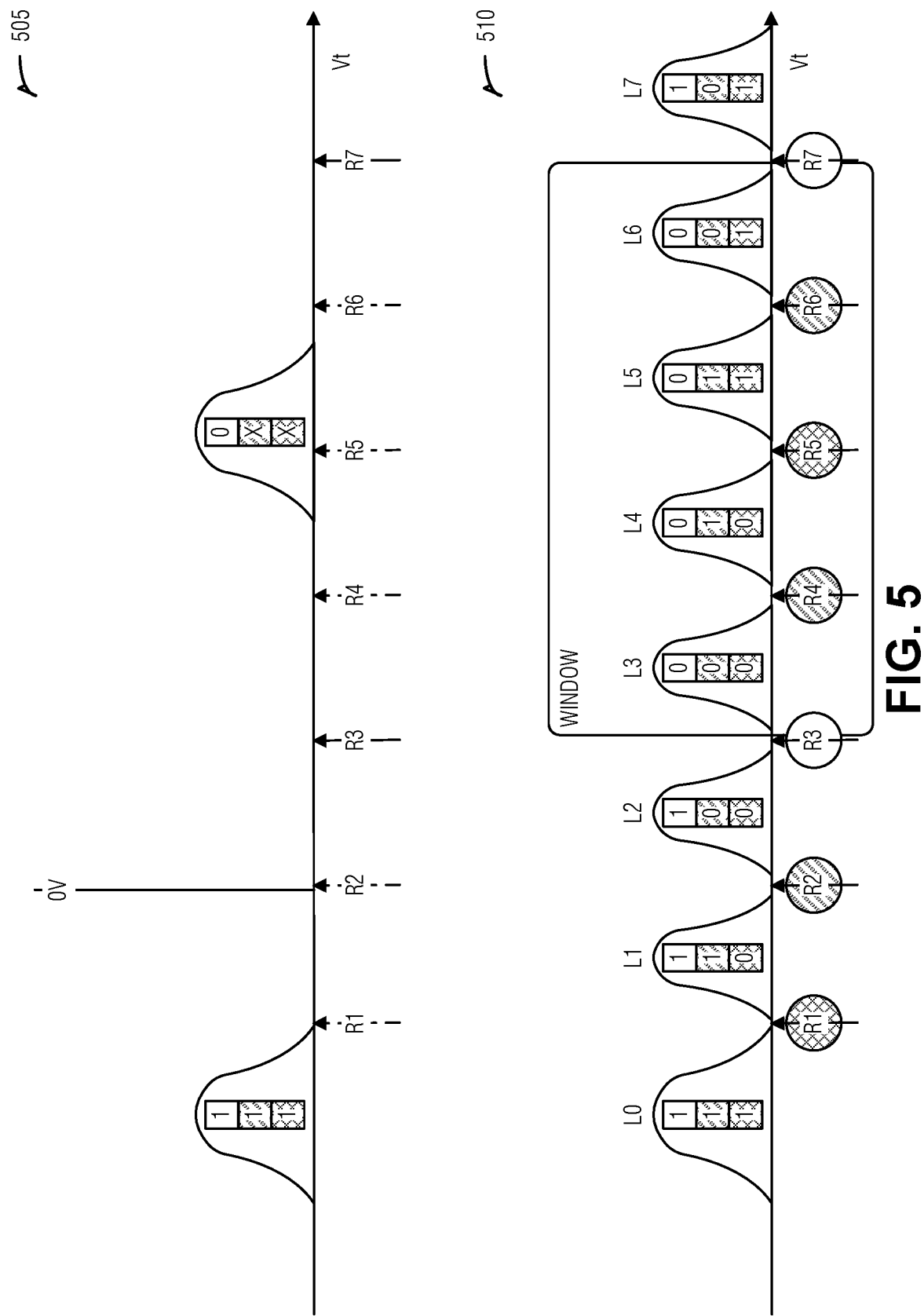

In an example, the single-level cell encoding uses charge distributions for an upper page and a lower page distinguished by an unmodified read voltage trim of the type of the MLC encoding. FIG. 4 illustrates this example. In an example, the unmodified read voltage is at least one of a lower page read voltage or an extra page read voltage. FIG. 5 illustrates this example. In an example, the memory device 215 does not track whether elements written to the target block are in the single-level encoding or the multi-level encoding for read voltage purposes. Because these examples use the same read trims and procedures without regard to whether a page is programmed using the MLC or the pSLC encodings, the memory controller 210 or the array controller 220 do not have to track what type of encoding is used on any given page.

Figure 6:
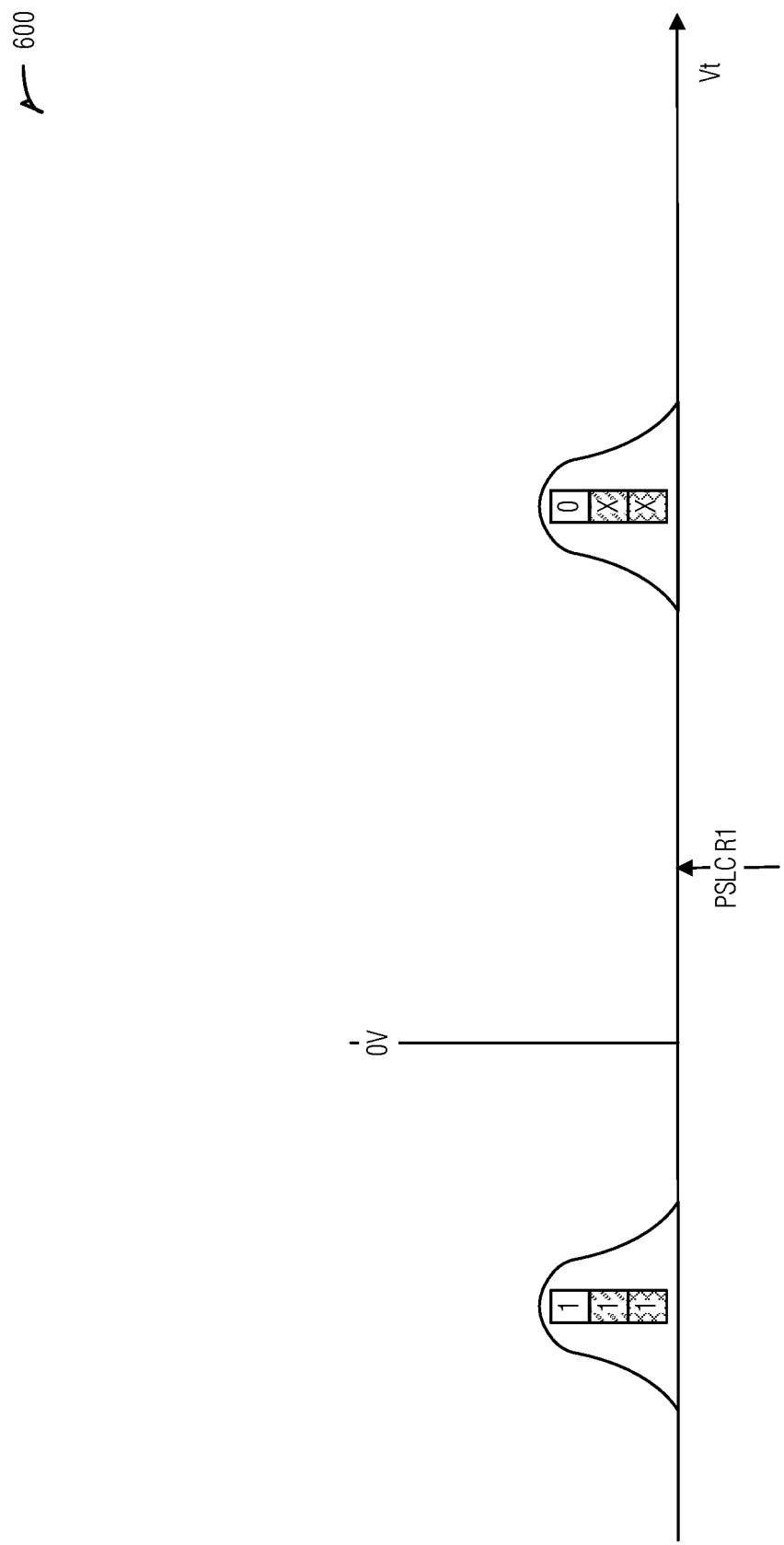

In an example, the pSLC uses charge distributions for an upper page and a lower page distinguished by a read voltage trim of a standard SLC type of encoding. This example is illustrated in FIG. 6. Here, the read voltage trim is different than that of the MLC encodings available to use in the array 225. Although the standard SLC encoding need not be used, in any of these cases, different read trims or procedures are used between the pSLC and MLC encoded pages. Thus, in an example, the memory device 215 (e.g., the array controller 220 or a data structure managed by the memory controller 210) tracks whether elements written to the target block are in the pSLC encoding or the MLC encoding. This information is used for reading, and can also be used in multi-pass programming of array 225 elements.

In an example, some smallest element of the array 225 must be completed in a single type of encoding. Thus, in an example, the array controller 220 is configured to fill a first element of the target block using the current encoding (e.g., MLC before switch to the high-speed write mode of operation) prior to writing the data for the accelerated write request to a second element of the target block using the single-level cell encoding. In an example, the first element and the second element are pages in the target block. In an example, the filling of the first page can include filler (e.g., dummy) data.

Figure 3:
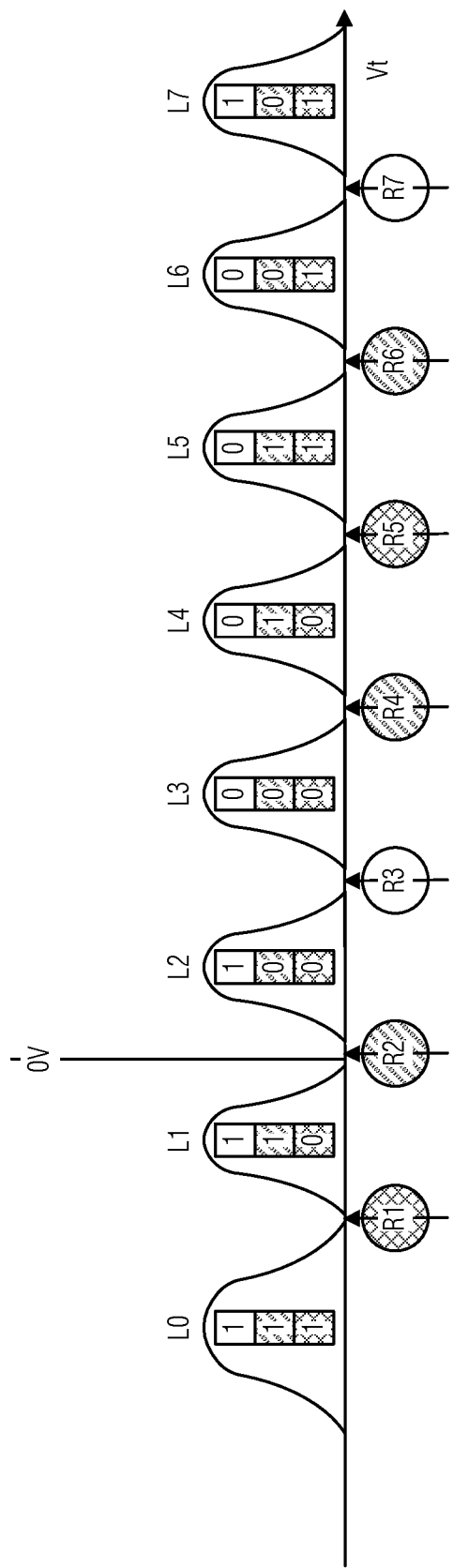
FIG. 3 illustrates an example of a single-pass write TLC grey code and read voltage positions.

FIG. 3 illustrates an example of a single-pass write TLC grey code 300 and read voltage positions. The distributions illustrate the eight voltage values corresponding to eight encoding states. The order in which the read voltages are applied in order to retrieve the lower page (LP), upper page (UP), and extra page (XP) of this TLC gray code 300 noted in the upper right of the figure. The read voltages for the pages are indicated by the shade-coordinated arrows on the bottom line. These data positions operate to reduce read times across the pages. The shading and read positions are used in FIGS. 4-6 below.

FIGS. 4-6 illustrate examples of pSLC grey codes. FIG. 4 illustrates an example pSLC gray code 405 in which the lower page of the TLC grey code 410 is used for the single bit storage. The illustrated window corresponds to a '0' value in the lower page. In this example, there is no need to track which pages are written in pSLC or TLC in order to set the read trims or procedures.

FIG. 5 illustrates an example pSLC gray code 505 in which the extra page of the TLC grey 510 code is used for the single bit storage. The illustrated window corresponds to a '0' value in the extra page. In this example, as in the example illustrated in FIG. 4, there is no need to track which pages are written in pSLC or TLC in order to set the read trims or procedures. Note that, for the examples of FIGS. 5 and 6, the pSLC '0' distribution can be wider than that of the TLC distributions. However, the pSLC '0' distribution fits within the corresponding TLC distributions in which the TLC page being used (e.g., lower or extra) has the same value (e.g., '0').

With respect to the examples of FIGS. 4 and 5, The missing pages (i.e. the XP/UP left blank in FIG. 4) are automatically skipped by the flash translation layer (FTL)

because no logical to physical (L2P) pointer is written to record this physical address for the XP and UP pages. However, some scanning processes—such as data retention, read disturb, binary search, etc.—can incorrectly process these unused pages. To address this, metadata (e.g., in the relevant page) can indicate (e.g., via a bit) that the other pages do not exist (e.g., are not relevant). Thus, the scan processes can read the relevant page (e.g., LP or XP) first to determine whether the other pages should be processed.

FIG. 6 illustrates an example pSLC gray code 600 in which the pSLC distributions do not conform to the TLC distributions as was the case in the examples of FIGS. 4 and 5 above. For example, in this example, the same techniques and trims used to write standard SLC can be employed. However, as the media can have mixed TLC and pSLC encodings, there is a need to track which segments (e.g., pages) are written as pSLC or TLC in order to properly read the pSLC values. An advantage to this additional overhead, however, can include reduced read or write times.

In an example, pSLC pages can be tracked with a bit in the L2P pointers or in a dedicated table. Having this information available in advance can enable different read operation to access pSLC pages. For example, a faster single strobe read can be used in single pass MLC gray codes, or, in dual-pass MLC gray codes, first pass levels can be used for pSLC—leaving UP, XP, etc. unprogrammed—when switching to from the low-speed write to the high-speed write. Here, the translation layer is updated to for all the data belonging to the lower pages "converted" to pSLC. In an example, the "conversion" can be logged in the sync point for application management instead of re-flush all the of the tables.

Figure 7:
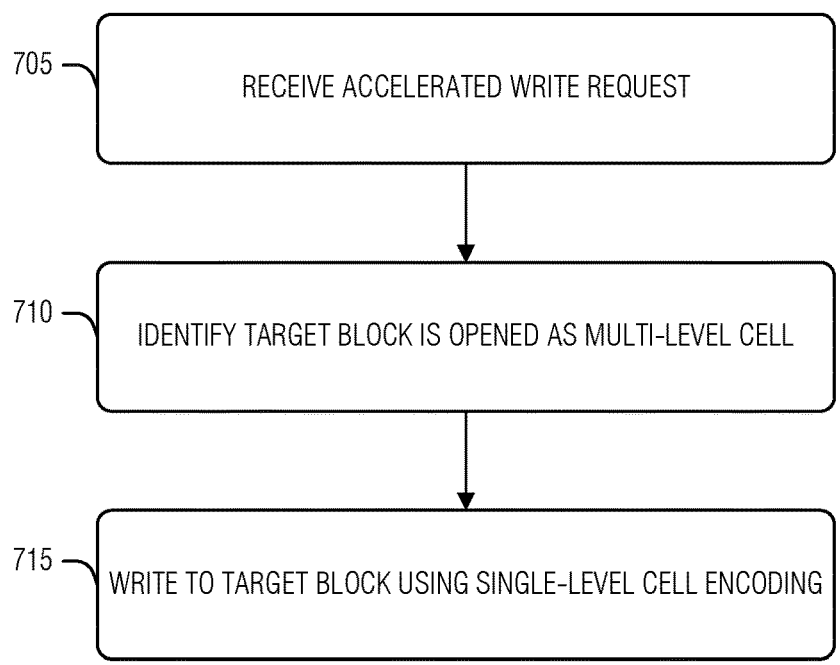
FIG. 7 illustrates a flowchart of a method for adjustable NAND write performance.

FIG. 7 illustrates a flowchart of a method 700 for adjustable NAND write performance. The operations of the method 700 are performed via computational hardware, such as that described above or below (e.g., a controller, processing circuitry, etc.).

At operation 705, an accelerated write request is received from a controller of the memory device. In an example, the memory device is a NAND device.

At operation 710, it is identified that a target block for external writes is opened as a multi-level cell block. In an example, an external write is any write that does not originate from circuitry of the memory device. In an example, the target block is alone in being open for external writes.

At operation 715, data for the accelerated write request is written to the target block using a single-level cell encoding. In an example, the single-level cell encoding uses charge distributions based on charge distributions for a type of multi-level cell encoding for the target block. In an example, the type of multi-level cell encoding is a TLC encoding or greater.

In an example, the single-level cell encoding uses charge distributions for an upper page and a lower page distinguished by an unmodified read voltage trim of the type of multi-level cell encoding. In an example, the unmodified read voltage is at least one of a lower page read voltage or an extra page read voltage. In an example, the memory device does not track whether elements written to the target block are in the single-level encoding or the multi-level encoding for read voltage purposes.

In an example, the single-level cell encoding uses charge distributions for an upper page and a lower page distinguished by a read voltage trim of a single-level cell type of cell encoding that is different than any read voltage trim of the type of multi-level cell encoding. In an example, the memory device tracks whether elements written to the target block are in the single-level encoding or the multi-level encoding for read voltage purposes.

In an example, the operations of the method 700 can be expanded to include filing a first element of the target block using the multi-level cell encoding prior to writing the data for the accelerated write request to a second element of the target block using the single-level cell encoding. In an example, the first element and the second element are pages in the target block.

Figure 8:
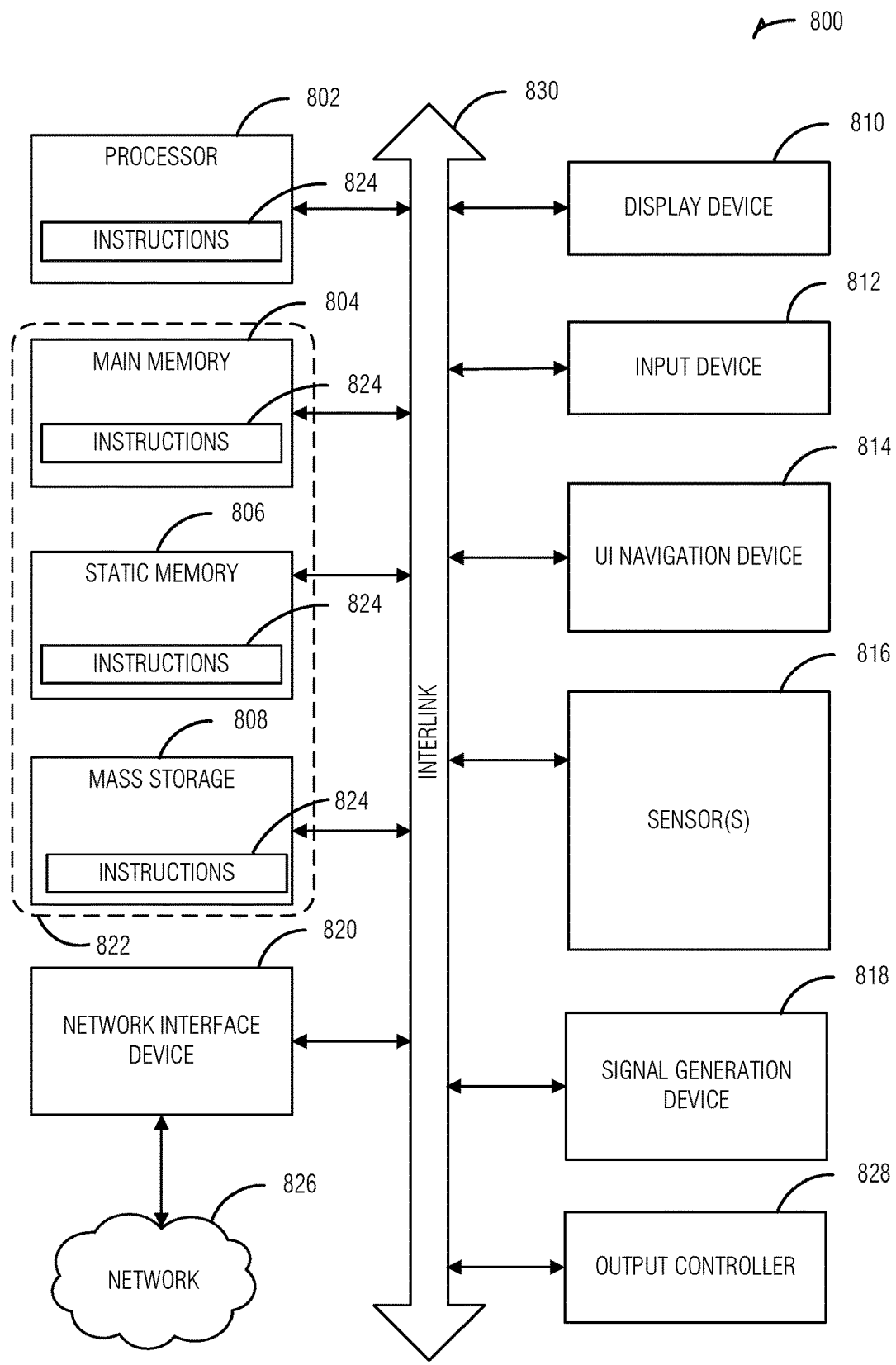
FIG. 8 is a block diagram illustrating an example of a machine upon which one or more embodiments can be implemented.

FIG. 8 illustrates a block diagram of an example machine 800 upon which any one or more of the techniques (e.g., methodologies) discussed herein can perform. In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) can include a hardware processor 802 (e.g., a central processing unit (CPU), a graphics processing unit (GPU), a hardware processor core, or any combination thereof, such as the memory controller 115, etc.), a main memory 804 and a static memory 806, some or all of which can communicate with each other via an interlink (e.g., bus) 808. The machine 800 can further include a display unit 810, an alphanumeric input device 812 (e.g., a keyboard), and a user interface (UI) navigation device 814 (e.g., a mouse). In an example, the display unit 810, input device 812 and UI navigation device 814 can be a touch screen display. The machine 800 can additionally include a storage device (e.g., drive unit) 808, a signal generation device 818 (e.g., a speaker), a network interface device 820, and one or more sensors 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 808 can include a machine readable medium 822 on which is stored one or more sets of data structures or instructions 824 (e.g., software) embodying or utilized by any one or more of the techniques or functions described herein. The instructions 824 can also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 808 can constitute the machine readable medium 822.

While the machine readable medium 822 is illustrated as a single medium, the term "machine readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 can further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks) such as those defined by the Third Generation Partnership Project (3GPP) families of standards (e.g., 3G, 4G, 5G, Long Term Evolution (LTE), etc.), Plain Old Telephone (POTS) networks, and wireless data networks (e.g., Institute of Electrical and Electronics Engineers (IEEE) 802.11 family of standards known as Wi-Fi®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the communications network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that can store, encoding or carrying instructions for execution by the machine 800, and includes digital or analog communications signals or other intangible medium to facilitate communication of such software.

Additional Examples

Example 1 is a memory device for adjustable NAND write performance, the memory device comprising: an interface to receive an accelerated write request from a controller of the memory device; and processing circuitry to: identify that a target block for external writes is opened as a multi-level cell block; and write data for the accelerated write request to the target block using a single-level cell encoding.

In Example 2, the subject matter of Example 1, wherein only the target block is open for external writes.

In Example 3, the subject matter of any of Examples 1-2, wherein the single-level cell encoding has charge distributions based on charge distributions for a type of multi-level cell encoding for the target block.

In Example 4, the subject matter of Example 3, wherein the type of multi-level cell encoding is a triple-level cell (TLC) encoding or greater.

In Example 5, the subject matter of any of Examples 3-4, wherein the single-level cell encoding has charge distributions for an upper page and a lower page distinguished by an unmodified read voltage trim of the type of multi-level cell encoding.

In Example 6, the subject matter of Example 5, wherein the unmodified read voltage is at least one of a lower page read voltage or an extra page read voltage.

In Example 7, the subject matter of any of Examples 5-6, wherein the memory device is configured to not track whether elements written to the target block are in the single-level encoding or the multi-level cell encoding for read voltage purposes.

In Example 8, the subject matter of any of Examples 3-7, wherein the single-level cell encoding has charge distributions for an upper page and a lower page distinguished by a read voltage trim of a single-level cell type of cell encoding that is different than any read voltage trim of the type of multi-level cell encoding.

In Example 9, the subject matter of any of Examples 1-8, wherein the processing circuitry is configured to fill a first element of the target block encoded with the multi-level cell encoding prior to a write of the data for the accelerated write request to a second element of the target block that is encoded with the single-level cell encoding.

In Example 10, the subject matter of Example 9, wherein the first element and the second element are pages in the target block.

In Example 11, the subject matter of any of Examples 1-10, wherein the memory device is a NAND device.

In Example 12, the subject matter of any of Examples 1-11, wherein an external write is any write that does not originate from circuitry of the memory device.

Example 13 is a method for adjustable NAND write performance, the method comprising: receiving, at a memory device, an accelerated write request from a controller of the memory device; identifying, at the memory device, that a target block for external writes is opened as a multi-level cell block; and writing, by the memory device, data for the accelerated write request to the target block using a single-level cell encoding.

In Example 14, the subject matter of Example 13, wherein the target block is alone in being open for external writes.

In Example 15, the subject matter of any of Examples 13-14, wherein the single-level cell encoding uses charge distributions based on charge distributions for a type of multi-level cell encoding for the target block.

In Example 16, the subject matter of Example 15, wherein the type of multi-level cell encoding is a triple-level cell (TLC) encoding or greater.

In Example 17, the subject matter of any of Examples 15-16, wherein the single-level cell encoding uses charge distributions for an upper page and a lower page distinguished by an unmodified read voltage trim of the type of multi-level cell encoding.

In Example 18, the subject matter of Example 17, wherein the unmodified read voltage is at least one of a lower page read voltage or an extra page read voltage.

In Example 19, the subject matter of any of Examples 17-18, wherein the memory device does not track whether elements written to the target block are in the single-level encoding or the multi-level cell encoding for read voltage purposes.

In Example 20, the subject matter of any of Examples 15-19, wherein the single-level cell encoding uses charge distributions for an upper page and a lower page distinguished by a read voltage trim of a single-level cell type of cell encoding that is different than any read voltage trim of the type of multi-level cell encoding.

In Example 21, the subject matter of any of Examples 13-20, comprising filling a first element of the target block using the multi-level cell encoding prior to writing the data for the accelerated write request to a second element of the target block using the single-level cell encoding.

In Example 22, the subject matter of Example 21, wherein the first element and the second element are pages in the target block.

In Example 23, the subject matter of any of Examples 13-22, wherein the memory device is a NAND device.

In Example 24, the subject matter of any of Examples 13-23, wherein an external write is any write that does not originate from circuitry of the memory device.

Example 25 is a machine readable medium including instructions for adjustable NAND write performance, the instructions, when executed by processing circuitry, cause the processing circuitry to perform operations comprising: receiving, at a memory device, an accelerated write request from a controller of the memory device; identifying, at the memory device, that a target block for external writes is opened as a multi-level cell block; and writing, by the memory device, data for the accelerated write request to the target block using a single-level cell encoding.

In Example 26, the subject matter of Example 25, wherein the target block is alone in being open for external writes.

In Example 27, the subject matter of any of Examples 25-26, wherein the single-level cell encoding uses charge distributions based on charge distributions for a type of multi-level cell encoding for the target block.

In Example 28, the subject matter of Example 27, wherein the type of multi-level cell encoding is a triple-level cell (TLC) encoding or greater.

In Example 29, the subject matter of any of Examples 27-28, wherein the single-level cell encoding uses charge distributions for an upper page and a lower page distinguished by an unmodified read voltage trim of the type of multi-level cell encoding.

In Example 30, the subject matter of Example 29, wherein the unmodified read voltage is at least one of a lower page read voltage or an extra page read voltage.

In Example 31, the subject matter of any of Examples 29-30, wherein the memory device does not track whether elements written to the target block are in the single-level encoding or the multi-level cell encoding for read voltage purposes.

In Example 32, the subject matter of any of Examples 27-31, wherein the single-level cell encoding uses charge distributions for an upper page and a lower page distinguished by a read voltage trim of a single-level cell type of cell encoding that is different than any read voltage trim of the type of multi-level cell encoding.

In Example 33, the subject matter of any of Examples 25-32, wherein the operations comprise filling a first element of the target block using the multi-level cell encoding prior to writing the data for the accelerated write request to a second element of the target block using the single-level cell encoding.

In Example 34, the subject matter of Example 33, wherein the first element and the second element are pages in the target block.

In Example 35, the subject matter of any of Examples 25-34, wherein the memory device is a NAND device.

In Example 36, the subject matter of any of Examples 25-35, wherein an external write is any write that does not originate from circuitry of the memory device.

Example 37 is a system for adjustable NAND write performance, the system comprising: means for receiving, at a memory device, an accelerated write request from a controller of the memory device; means for identifying, at the memory device, that a target block for external writes is opened as a multi-level cell block; and means for writing, by the memory device, data for the accelerated write request to the target block using a single-level cell encoding.

In Example 38, the subject matter of Example 37, wherein the target block is alone in being open for external writes.

In Example 39, the subject matter of any of Examples 37-38, wherein the single-level cell encoding uses charge distributions based on charge distributions for a type of multi-level cell encoding for the target block.

In Example 40, the subject matter of Example 39, wherein the type of multi-level cell encoding is a triple-level cell (TLC) encoding or greater.

In Example 41, the subject matter of any of Examples 39-40, wherein the single-level cell encoding uses charge distributions for an upper page and a lower page distinguished by an unmodified read voltage trim of the type of multi-level cell encoding.

In Example 42, the subject matter of Example 41, wherein the unmodified read voltage is at least one of a lower page read voltage or an extra page read voltage.

In Example 43, the subject matter of any of Examples 41-42, wherein the memory device does not track whether elements written to the target block are in the single-level encoding or the multi-level cell encoding for read voltage purposes.

In Example 44, the subject matter of any of Examples 39-43, wherein the single-level cell encoding uses charge distributions for an upper page and a lower page distinguished by a read voltage trim of a single-level cell type of cell encoding that is different than any read voltage trim of the type of multi-level cell encoding.

In Example 45, the subject matter of any of Examples 37-44, comprising means for filling a first element of the target block using the multi-level cell encoding prior to writing the data for the accelerated write request to a second element of the target block using the single-level cell encoding.

In Example 46, the subject matter of Example 45, wherein the first element and the second element are pages in the target block.

In Example 47, the subject matter of any of Examples 37-46, wherein the memory device is a NAND device.

In Example 48, the subject matter of any of Examples 37-47, wherein an external write is any write that does not originate from circuitry of the memory device.

Example 49 is at least one machine-readable medium including instructions that, when executed by processing circuitry, cause the processing circuitry to perform operations to implement of any of Examples 1-48.

Example 50 is an apparatus comprising means to implement of any of Examples 1-48.

Example 51 is a system to implement of any of Examples 1-48.

Example 52 is a method to implement of any of Examples 1-48.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device for adjustable NAND write performance, the memory device comprising:
   an interface to receive an accelerated write request from a controller of the memory device, the accelerated write request being a write request that is designated as accelerated by at least one of:
      an explicit indication by a requestor of the accelerated write request; or
      the memory device being in a high-speed mode of operation; and
   processing circuitry to:
      identify that a target block for external writes is opened as a multi-level cell block, an external write is any write that does not originate from the memory device, the target block being a memory block in a memory array and a current external write cursor for the external writes; and
      write data for the accelerated write request to the target block using a single-level cell encoding.

2. The memory device of claim 1, wherein only the target block is open for external writes.

3. The memory device of claim 1, wherein the single-level cell encoding has charge distributions based on charge distributions for a type of multi-level cell encoding for the target block.

4. The memory device of claim 3, wherein the type of multi-level cell encoding is a triple-level cell (TLC) encoding or greater.

5. The memory device of claim 3, wherein the single-level cell encoding has charge distributions for an upper page and a lower page distinguished by an unmodified read voltage trim of the type of multi-level cell encoding.

6. The memory device of claim 5, wherein the unmodified read voltage is at least one of a lower page read voltage or an extra page read voltage.

7. The memory device of claim 5, wherein the memory device is configured to not track whether elements written to the target block are in the single-level encoding or the multi-level cell encoding for read voltage purposes.

8. The memory device of claim 3, wherein the single-level cell encoding has charge distributions for an upper page and a lower page distinguished by a read voltage trim of a single-level cell type of cell encoding that is different than any read voltage trim of the type of multi-level cell encoding.

9. A method for adjustable NAND write performance, the method comprising:
   receiving, at a memory device, an accelerated write request from a controller of the memory device, the accelerated write request being a write request that is designated as accelerated by at least one of:
      an explicit indication by a requestor of the accelerated write request: or
      the memory device being in a high-speed mode of operation;

identifying, at the memory device, that a target block for external writes is opened as a multi-level cell block, an external write is any write that does not originate from the memory device, the target block being a memory block in a memory array and a current external write cursor for the external writes; and writing, by the memory device, data for the accelerated write request to the target block using a single-level cell encoding.

10. The method of claim 9, wherein the target block is alone in being open for external writes.

11. The method of claim 9, wherein the single-level cell encoding uses charge distributions based on charge distributions for a type of multi-level cell encoding for the target block.

12. The method of claim 11, wherein the type of multi-level cell encoding is a triple-level cell (TLC) encoding or greater.

13. The method of claim 11, wherein the single-level cell encoding uses charge distributions for an upper page and a lower page distinguished by an unmodified read voltage trim of the type of multi-level cell encoding.

14. The method of claim 13, wherein the unmodified read voltage is at least one of a lower page read voltage or an extra page read voltage.

15. The method of claim 13, wherein the memory device does not track whether elements written to the target block are in the single-level encoding or the multi-level cell encoding for read voltage purposes.

16. The method of claim 11, wherein the single-level cell encoding uses charge distributions for an upper page and a lower page distinguished by a read voltage trim of a single-level cell type of cell encoding that is different than any read voltage trim of the type of multi-level cell encoding.

17. A non-transitory machine readable medium including instructions for adjustable NAND write performance, the instructions, when executed by processing circuitry, cause the processing circuitry to perform operations comprising:

receiving, at a memory device, an accelerated write request from a controller of the memory device, the accelerated write request being a write request that is designated as accelerated by at least one of:

an explicit indication by a requestor of the accelerated write request; or the memory device being in a high-speed mode of operation;

identifying, at the memory device, that a target block for external writes is opened as a multi-level cell block, an external write is any write that does not originate from the memory device, the target block being a memory block in a memory array and a current external write cursor for the external writes; and writing, by the memory device, data for the accelerated write request to the target block using a single-level cell encoding.

18. The machine readable medium of claim 17, wherein the target block is alone in being open for external writes.

19. The non-transitory machine readable medium of claim 17, wherein the single-level cell encoding uses charge distributions based on charge distributions for a type of multi-level cell encoding for the target block.

20. The non-transitory machine readable medium of claim 19, wherein the type of multi-level cell encoding is a triple-level cell (TLC) encoding or greater.

21. The non-transitory machine readable medium of claim 19, wherein the single-level cell encoding uses charge distributions for an upper page and a lower page distinguished by an unmodified read voltage trim of the type of multi-level cell encoding.

22. The non-transitory machine readable medium of claim 21, wherein the unmodified read voltage is at least one of a lower page read voltage or an extra page read voltage.

23. The non-transitory machine readable medium of claim 21, wherein the memory device does not track whether elements written to the target block are in the single-level encoding or the multi-level cell encoding for read voltage purposes.

24. The non-transitory machine readable medium of claim 19, wherein the single-level cell encoding uses charge distributions for an upper page and a lower page distinguished by a read voltage trim of a single-level cell type of cell encoding that is different than any read voltage trim of the type of multi-level cell encoding.

* * * * *